(12) United States Patent
Tseng et al.

(10) Patent No.: US 7,626,415 B1
(45) Date of Patent: Dec. 1, 2009

(54) METHOD AND APPARATUS FOR CONFIGURING AN INTEGRATED CIRCUIT

(75) Inventors: Chen Wei Tseng, Longmont, CO (US); Carl H. Carmichael, San Jose, CA (US); Gregory J. Miller, Broomfield, CO (US)

(73) Assignee: XILINX, Inc., San Jose, CA (US)

( * ) Notice: Subject to any disclaimer, the term of this patent is extended or adjusted under 35 U.S.C. 154(b) by 0 days.

(21) Appl. No.: 12/038,768

(22) Filed: Feb. 27, 2008

(51) Int. Cl.
  *H03K 19/003* (2006.01)
(52) U.S. Cl. ............................................. 326/9; 326/38
(58) Field of Classification Search ...................... 326/9, 326/14, 15, 37–41
  See application file for complete search history.

(56) References Cited

U.S. PATENT DOCUMENTS

| 6,614,259 | B2 | 9/2003 | Couts-Martin et al. |
| 7,075,328 | B2 | 7/2006 | Plants |
| 7,320,064 | B2 * | 1/2008 | Ramos et al. ............... 712/226 |

OTHER PUBLICATIONS

XAPP1004 (v1.2 ) Mar. 14, 2008, Miller, G., et al., Single-Event Upset Mitigation Design Flow for Xilinx FPGA PowerPC Systems, pp. 1-9, Xilinx, Inc. 2100 Logic Drive, San Jose, CA 95124.

XAPP989 (v1.2 ), Apr. 2, 2008, Carmichael, C. et al. "Correcting Single-Event Upsets with a Self-Hosting Configuration Management Core", pp. 1-9, Xilinx, Inc. 2100 Logic Drive, San Jose, CA 95124.

XAPP988 (v1.0) Mar. 13, 2008, Carmichael, Carl, et al., entitled "Correcting Single-Event Upsets in Virtex-4 Platform FPGA Configuration Memory", 1-21 pages, Xilinx, Inc., 2100 Logic Drive, San Jose, CA.

XAPP779 (v1.1) Feb. 19, 2007, Bridgford, Brendan, et al., entitled "Correcting Single-Event Upsets in Virtex-II Platform FPGA Configuration Memory", 1-19 pages, Xilinx, Inc., 2100 Logic Drive, San Jose, CA.

U.S. Appl. No. 12/038,763, filed Feb. 27, 2008, Tseng, C.W., et al., "Method and Apparatus for Configuring An Integrated Circuit", Xilinx, Inc. 2100 Logic Drive, San Jose, CA 95124.

* cited by examiner

*Primary Examiner*—Don P Le
(74) *Attorney, Agent, or Firm*—Kin-Wah Tong

(57) ABSTRACT

A configuration management system is disclosed. For example, an embodiment of the present invention provides a configuration management system comprising a configuration storage device containing configuration data, and an integrated circuit, coupled to the configuration storage device, where the integrated circuit comprising at least one configuration management controller for managing a configuration of the integrated circuit in accordance with the configuration data, where the integrated circuit is deployed in a radiation tolerant device.

19 Claims, 4 Drawing Sheets

METHOD AND APPARATUS FOR CONFIGURING AN INTEGRATED CIRCUIT

FIELD OF THE INVENTION

One or more aspects of the present invention relate generally to a configuration methodology and, in particular, to a configuration methodology related to configuring a memory of an integrated circuit (IC).

BACKGROUND OF THE INVENTION

An integrated circuit (IC) may include memory to store data bits, and many applications using an IC require memory to be reliable. For instance, a memory of a field programmable gate array (FPGA) is generally configured to provide one or more predefined functions, where the FPGA may have millions of configuration latches within a device. Generally, the configuration data stored in the memory of the FPGA is quite reliable, but depending on the environment that the FPGA is deployed, the configuration data in the memory of the FPGA can be corrupted or upset. For example, in space applications, the FPGA may be exposed to high energy charged particles (e.g., radiation) that may upset the configuration data. For example, a single event upset (SEU) may cause adverse effects on the expected functionality of the FPGA, e.g., altering the logic state of any static elements (e.g., latch, flip-flop, or random access memory (RAM)). Although most SEUs will not impact the FPGA's application, accumulation of SEUs may eventually interrupt a device's operation. To avoid accumulation of SEUs, active partial reconfiguration of the FPGA can be implemented. With the deployment of active partial reconfiguration, it is still possible for the device operation to be interrupted with a single SEU, such SEU is referred to as a single event function interrupt (SEFI) and device function can be recovered by a full device reconfiguration instead of a partial reconfiguration.

SUMMARY OF THE INVENTION

In one embodiment, a configuration management system is disclosed. For example, an embodiment of the present invention provides a configuration management system comprising a configuration storage device containing configuration data, and an integrated circuit, coupled to the configuration storage device, where the integrated circuit comprising at least one configuration management controller for managing a configuration of the integrated circuit in accordance with the configuration data, where the integrated circuit is deployed in a radiation tolerant device.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

Figure 1:
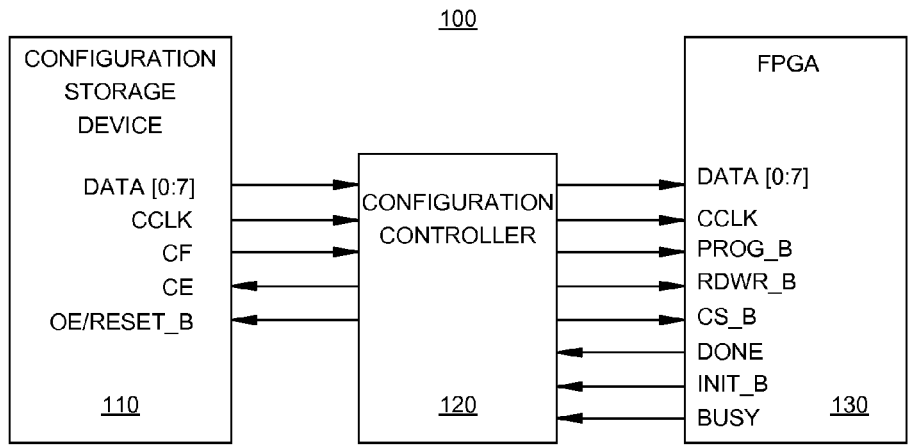
FIG. 1 illustrates an illustrative overview of a configuration management system where an external device hosts a configuration management for an FPGA.

FIG. 1 illustrates an illustrative overview of a configuration management system 100 where an external device hosts a configuration management for an integrated circuit, such as an FPGA. Note that although examples, such as an FPGA, may be used herein to illustrate embodiments of the present invention, in general, the techniques and structures may be used an integrated circuit. In one embodiment, the configuration management system 100 may comprise a configuration storage device 110, a configuration controller 120 and an FPGA 130. It should be noted that each of these devices or their combinations can be broadly interpreted as one or more integrated circuits. It should be further noted that although only one configuration storage device, one configuration controller and one FPGA are illustrated in FIG. 1, the present invention is not so limited. A configuration management system may employ any number of storage devices, configuration controllers and FPGAs. Additionally, the port interface between the configuration storage device and the configuration controller may vary depending on the type of configuration storage device that is deployed. In brief, the configuration storage device 110 contains configuration data that can be loaded onto the FPGA 130 (e.g., during initial power up) under the control of the configuration controller 120. For example, the configuration controller 120 may have detected a SEU and that the FPGA needs to be actively partial reconfigured or fully reconfigured using the configuration data stored in the configuration storage device 110.

In one embodiment, the configuration storage device 110, e.g., a programmable read only memory (PROM), and the configuration controller 120 can be implemented as one or more radiation hardened devices. Radiation hardened devices are devices that are designed to withstand the effects of high energy charged particles. As such, the functions of radiation hardened devices will not likely be corrupted or upset in the presence of cosmic rays, thereby making such devices ideal for use in extremely harsh environments such as space applications. Unfortunately, radiation hardened devices provide their superb reliability at a very high cost. It may be cost prohibitive to deploy all electronic components using only radiation hardened devices. Furthermore, radiation hardened devices are often one time programmable. As such, a mistake or a needed modification in the functions of the radiation hardened devices may further exacerbate the cost problem. Furthermore, a modification may also require an additional device burn or even board re-spin that again increases system cost and may possibly delay product releases.

In one embodiment, the FPGA 130 is employed as a radiation-tolerant device. Radiation-tolerant devices are also devices that are designed to withstand the effects of high energy charged particles. However, radiation-tolerant devices are generally designed such that high energy charged particles may not permanently damage the device, but the logic state of static memory elements on the device can be corrupted. Such corruptions may eventually impact the predefined function(s) of the radiation-tolerant devices. As such, radiation-tolerant devices which are less costly to deploy, may need to be reconfigured if and when SEU is detected.

It should be noted that illustrative interfaces (e.g., DATA [0:7], CCLK, CF, CE, OE/RESET_B, BUSY, RDWR_B and the like) are shown on the configuration device, the configuration controller, and the FPGA. It should be noted that these interfaces are only illustrative and are not intended to limit the present invention in any way. Another method of implementation is through the boundary scan interface, JTAG, to achieve the same goal.

In some embodiments, each of the configuration device, the configuration controller, and the FPGA can be implemented as a standalone device. However as further discussed below, in other embodiments, one or more of these devices may be included as part of an integrated circuit, such as in an FPGA. For example, in some FPGA embodiments, a memory array (not shown) may be used as configuration memory for the FPGA, and/or as block RAM (BRAM) of the FPGA.

In various embodiments of the present invention, the configuration controller can be implemented within the FPGA 130. For example, implementing the configuration controller in the FPGA will eliminate the need to provide a configuration controller via a radiation hardened device, thereby reducing cost, board space and power consumption, and further providing flexibility in making any modifications to the configuration controller.

Figure 2:
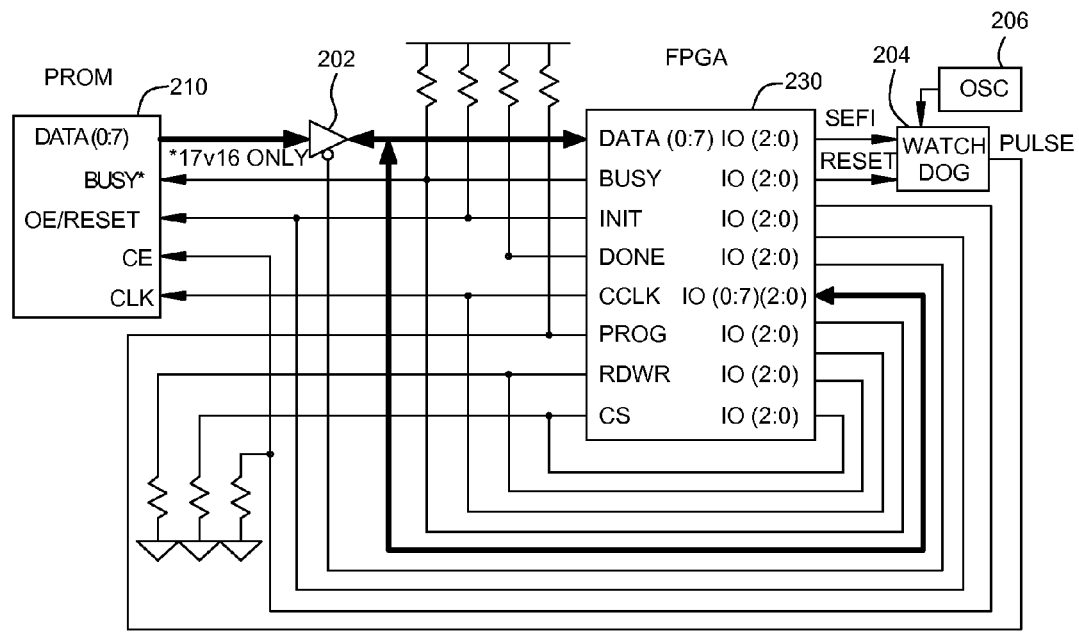
FIG. 2 illustrates an illustrative overview of a configuration management system where an FPGA hosts a configuration management in accordance with one embodiment of the present invention.

FIG. 2 illustrates an illustrative overview of a configuration management system where an FPGA hosts a configuration management in accordance with one embodiment of the present invention. In one embodiment, the configuration controller (or more broadly the functions performed by the configuration controller) has been shifted into the FPGA. For example, the configuration management system 200 may comprise a configuration storage device 210, an FPGA 230, a tri-state buffer 202, a watchdog circuit module 204 and an oscillator 206.

FIG. 2 also illustrates interfaces that may be employed on the configuration storage device 210 (e.g., XQR18V04 or XQR 17v16 available from Xilinx, Inc. of San Jose, Calif.) and an FPGA 230 (e.g., Virtex™-II series FPGA available from Xilinx, Inc. of San Jose, Calif.). It should be noted that these interfaces are only illustrative and should not be interpreted to limit the present invention. A brief description for each port or pin is now provided. The DATA (0:7) pins are for transmitting and receiving data, e.g., configuration data. The BUSY pin is held high during a read operation and held low for a write operation. The INIT pin is used to indicate that the FPGA is ready for receiving configuration data. The DONE pin is held high after a successful device configuration. The CCLK is a pin for providing a clock signal, e.g., by the FPGA or alternatively, by an external oscillator. The PROG pin is used to initialize the FPGA, e.g., initializing the FPGA in preparation for receiving configuration data. The RDWR pin is used to control the reading or the writing of data to/from the FPGA. The CS pin is a chip select pin for enabling or disabling the entire interface. The OE/RESET pin is used to reset the PROM. The clock enable (CE) pin is used to prepare the PROM for sending configuration data.

In operation, upon power up, all of the FPGA IOs may be tri-stated. The pull-downs on the CS pin and the RDWR pin may prepare the FPGA for data input while the pull-down on CE of the PROM readies the PROM for data output. It should be noted that the tri-state buffer 202 will be controlled in a manner that will regulate the flow of data from the PROM to FPGA. Upon successful configuration, the internal configuration management may control the outputs (e.g., triplicated outputs) and the PROM's CE line. It should be noted that in one embodiment, the internal configuration management as deployed in the FPGA may be triplicated, i.e., implemented as three distinct internal configuration management controllers (in an arrangement commonly referred to as triple modular redundancy or TMR). This redundancy is provided in one embodiment since the configuration management controllers now reside on a radiation-tolerant device and not on a radiation hardened device. As such, for each function that is performed by the three internal configuration management controllers, three control signals are generated. It should be noted that although three configuration management controllers are not specifically shown in the FPGA 230, this is indirectly shown using the reference "IO (2:0)", where "2" indicates three inputs comprising "0", "1" and "2". A majority rule algorithm may be implemented such that a configuration management controller function is performed if two or more signals are received from the three internal configuration management controllers to execute the function. As such, SEUs that impact the functions of only one of the three configuration management controllers will not impact the overall performance of the FPGA. Although three internal configuration management controllers are disclosed, the present invention can be implemented with additional number of internal configuration management controllers, e.g., 5, 7, and so on.

In one embodiment, the external watchdog circuit module 204 and the oscillator 206 may provide a fall back mechanism for configuration failure or SEFI recovery. An illustrative block diagram of the watchdog circuit module 204 is provided in FIG. 3. The reader is encouraged to refer to both FIGS. 2 and 3 to better understand the operation of the watchdog circuit module 204. In operation, the watchdog circuit module 204 is tasked with firing a one-shot pulse 335 (e.g., a minimal pulse of 300 ns) via a signal generator 330 (e.g., a one-shot module) to the FPGA's PROG pin for resetting the FPGA. For instance, there may be two different triggers, which may be used together or used independently, that will cause the watchdog circuit module 204 to fire the one-shot pulse.

In one embodiment, the three internal configuration management controllers are designed to provide a reset signal to reset a counter 320 within the watchdog circuit module 204. Again, it should be noted that the reset signal sent to the watchdog circuit module 204 is derived from reset signals that may be generated by the three internal configuration management controllers. As such, in one embodiment, two or more reset signals generated by the three internal configuration management controllers in accordance with a majority rule algorithm will cause a reset signal to be sent to the watchdog circuit module. This reset signal can be perceived broadly as a heartbeat signal representing that the majority of the three internal configuration management controllers is functioning normally. When the rest signal is received, the counter 320 is reset, thereby preventing the one-shot module from generating the one-shot pulse. However, if a reset signal is not received within a predefined time limit or time period, then the counter 320 will not be reset and the counter will cause the one-shot module 330 to generate the one-shot pulse. The lack of a reset signal may potentially represent that the majority of the three internal configuration management controllers is no longer functioning normally, e.g., at least two of the three internal configuration management controllers are corrupted such that they are no longer able to generate the rest signal on a predefined basis. This approach allows the watchdog circuit module 204 to periodically determine whether a reconfiguration of the FPGA is necessary.

In one embodiment, the three internal configuration management controllers are designed to provide an alarm signal, e.g., a SEFI-flag signal, to a signal detector, e.g., a rising edge detector 310, within the watchdog circuit module 204. Again, it should be noted that the SEFI-flag signal sent to the watchdog circuit module 204 is derived from SEFI-flag signals that may be generated by the three internal configuration management controllers. As such, in one embodiment, two or more SEFI-flag signals generated by the three internal configuration management controllers in accordance with a majority rule algorithm will cause an SEFI-flag signal to be sent to the watchdog circuit module. This SEFI-flag signal represents that the majority of the three internal configuration management controllers has detected an SEFI. More specifically, the majority of the three internal configuration management controllers has determined that the SEFI is severe enough that it is necessary to reconfigure the FPGA 230. When the SEFI-flag signal is received, the rising edge detector 310 detects the signal and causes the one-shot module to generate the one-shot pulse. The rising edge detector 310 observes a rising edge from the SEFI output of the FPGA's configuration management. It should be noted that the present invention is not limited by any specific configuration memory management or SEFI detection methods that may be employed by the three internal configuration management controllers. For example, the three internal configuration management controllers may employ an SEFI detection method that periodically performs a readback of the FPGA configuration memory to calculate a Cyclic Redundancy Check (CRC) value that can then be compared with a predetermined value. If a difference exists between the two values, then the internal configuration management controller may deem that an SEFI has occurred.

In one embodiment, the watchdog circuit module 204 is implemented on a radiation hardened device. This additional feature increases reliability since the watchdog circuit module will not likely be upset by an SEFI that may have negatively affected the FPGA including the configuration management controllers residing in the FPGA. Although the watchdog circuit module 204 may be implemented on a radiation hardened device, this approach is still more efficient than implementing the entire configuration management controller on a radiation hardened device, since the configuration management controller is much more complex than a watchdog circuit module. For example, the functions performed by a configuration management controller are more likely to require updating than the functions performed by the watchdog circuit module. Since the configuration management controller is residing on an FPGA, the ease of updating the configuration management controller is significantly increased without incurring a high cost. Furthermore, implementing only the watchdog circuit module 204 on a radiation hardened device will reduce the overall size of the radiation hardened device.

Figure 3:
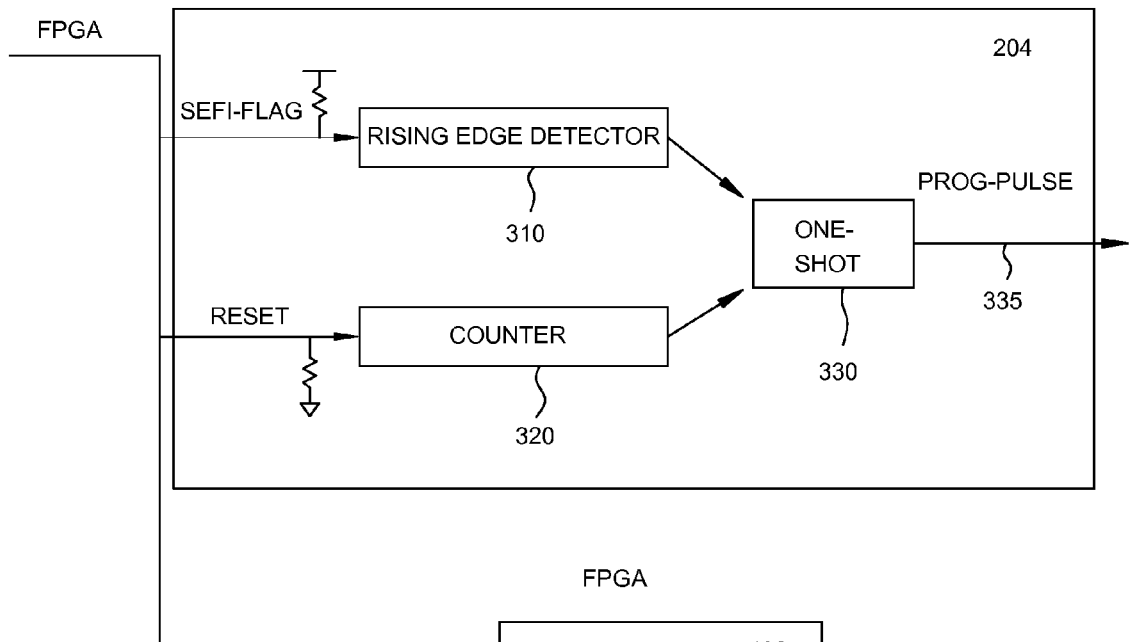
FIG. 3 illustrates an illustrative overview of a watchdog circuit module in accordance with one embodiment of the present invention.
Figure 4:
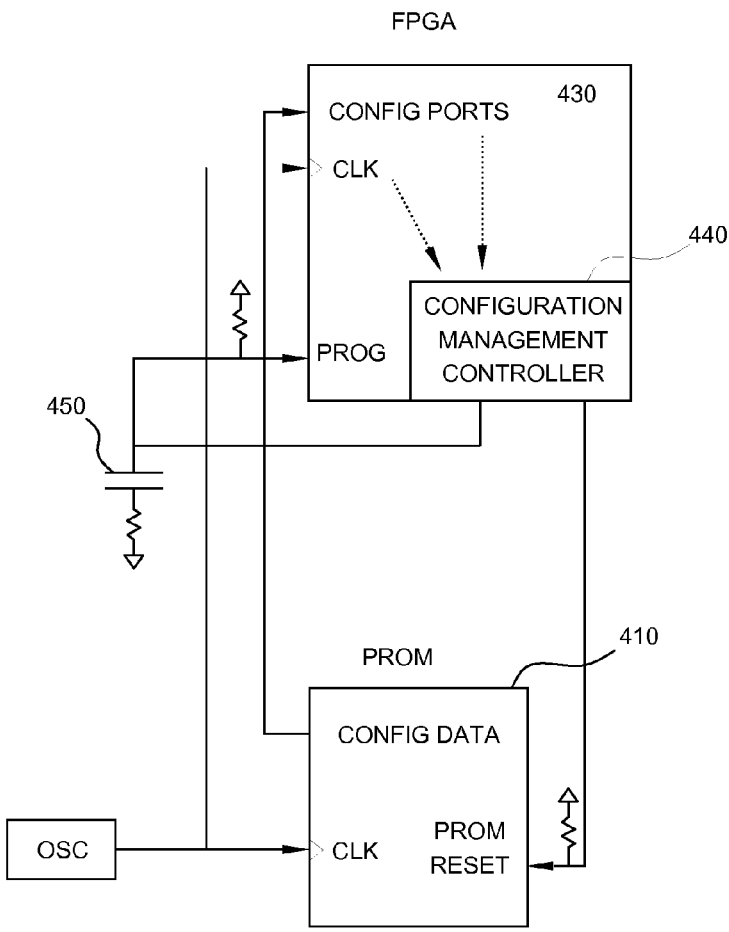
FIG. 4 illustrates an illustrative overview of a configuration management system where an FPGA hosts a configuration management in accordance with another embodiment of the present invention.

FIG. 4 illustrates an illustrative overview of a configuration management system where an FPGA hosts a configuration management in accordance with another embodiment of the present invention. More specifically, in this embodiment, the watchdog circuit module as shown in FIGS. 2 and 3 has been omitted. It should be noted that the FPGA and PROM of FIG. 4 are very similar to the FPGA and PROM as previously shown in FIG. 2. As such, many of the details of these two devices are not repeated in FIG. 4, whereas FIG. 4 only illustrates changes that are needed in omitting the watchdog circuit module.

Figure 5:
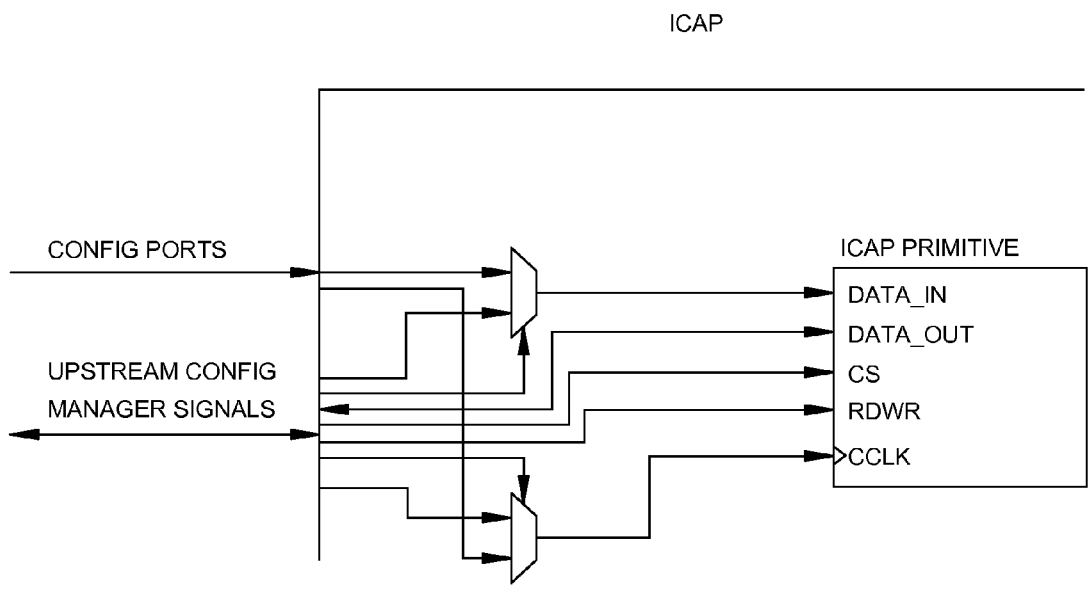
FIG. 5 illustrates an illustrative overview of an internal configuration access port (ICAP) module in accordance with one embodiment of the present invention.

In one embodiment, upon power up, the PROM 410 will configure the FPGA 430 through the configurations ports or pins as discussed above. However, after initial configuration, the internal configuration management controller 440 (sometimes known as an internal configuration access port (ICAP) configuration manager) will periodically perform readback through an ICAP interface, as shown in FIG. 5, and will scrub with data coming through the initial configuration ports. That is, data may be periodically read through an ICAP interface and overwritten with data (e.g., scrubbed). It should be noted that FIG. 5 only illustrates an illustrative overview of an (ICAP) configuration manager module that is implemented within the FPGA 430 in accordance with one embodiment of the present invention. As such, the specific implementation of the (ICAP) configuration manager module in FIG. 5 should not be interpreted as a limitation of the present invention.

In one embodiment, the internal configuration management controller 440 is also implemented in triplicate as discussed above where they operate in accordance with a majority rule algorithm. In operation, if the majority of the three internal configuration management controllers has detected an SEFI that is severe enough to reconfigure the FPGA 430, then a signal is sent to the PROG pin of the FPGA 430 to initiate reconfiguration of the FPGA. It should be noted that a capacitor 450 is employed in this embodiment to ensure that the signal provided to the PROG pin will have a signal duration sufficient to trigger the reconfiguration process, e.g., at least a 300 ns pulse.

As such, the FPGA hosting a configuration management of FIG. 4 is very similar to that of FIG. 2. One difference is that since the watchdog circuit module is omitted, the feature of monitoring the heartbeat signals from the configuration management controllers is also omitted. Omitting this feature reduces the significant cost of having to provide a watchdog circuit module in a radiation hardened device, but it also removes an additional monitoring feature. However, the implementation of FIG. 4 may provide sufficient reliability for certain applications.

Figure 6:
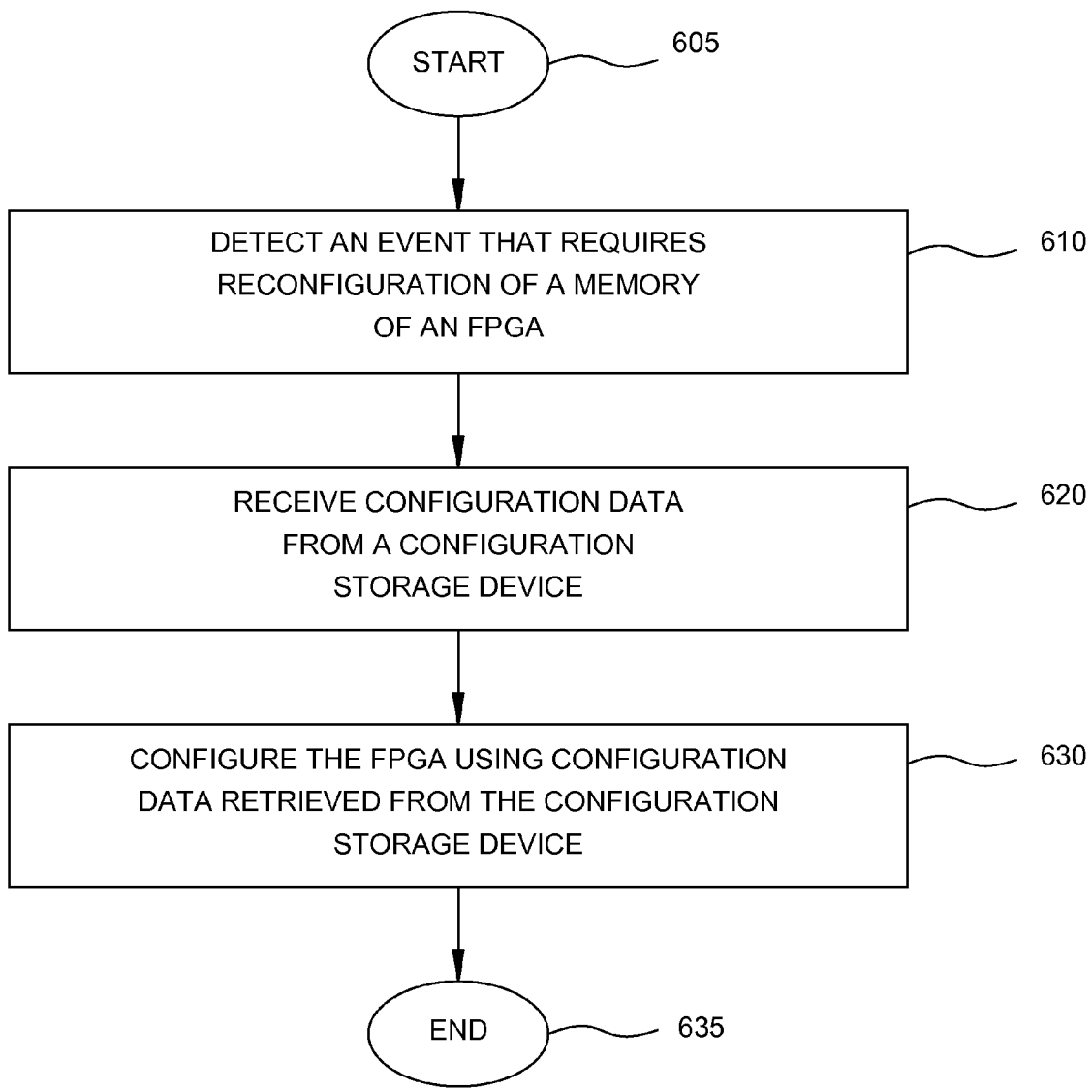
FIG. 6 illustrates a flow chart of a method for reconfiguring a memory of an FPGA in accordance with one or more embodiments of the present invention.

FIG. 6 illustrates a flow chart of a method for reconfiguring a memory of an FPGA in accordance with one or more embodiments of the present invention. For example, method 600 can be implemented by an FPGA hosting one or more configuration management controllers as discussed above, where the FPGA is implemented on a radiation tolerant device.

Method 600 starts in step 605 and proceeds to step 610. In step 610, method 600 detects an event that requires either full or active partial reconfiguration of a memory, e.g., configuration memory, of the FPGA. Alternatively, in one embodiment, this detection may only trigger full reconfiguration while active partial reconfiguration is always running. As discussed above, if the detected event is a SEFI that has been detected by one or more configuration management controllers hosted within the FPGA. Alternatively, if an external device, e.g., a watchdog circuit module, is employed, then the detected event can be the loss of a heartbeat or reset signal. Once it is determined that reconfiguration of the FPGA is necessary, then a signal is generated to initialize the reconfiguration of the FPGA, e.g., a signal is provided to the PROG pin of the FPGA to prepare the FPGA for receiving reconfiguration data.

In step 620, method 600 receives reconfiguration data from a configuration storage device, e.g., from a PROM. In one embodiment, the reconfiguration data is received from a configuration storage device that has been implemented in a radiation hardened device.

In step 630, method 600 configures the FPGA using the configuration data retrieved from the configuration storage device. Method 600 then ends in step 635.

It should be noted that although not specifically specified, one or more steps of method 600 may include a storing, displaying and/or outputting step as required for a particular application. In other words, any data, records, fields, and/or intermediate results discussed in the method can be stored, displayed and/or outputted to another device as required for a particular application. Furthermore, steps or blocks in FIG. 6 that recite a determining operation or involve a decision, do not necessarily require that both branches of the determining operation be practiced. In other words, one of the branches of the determining operation can be deemed as an optional step.

Figure 7:
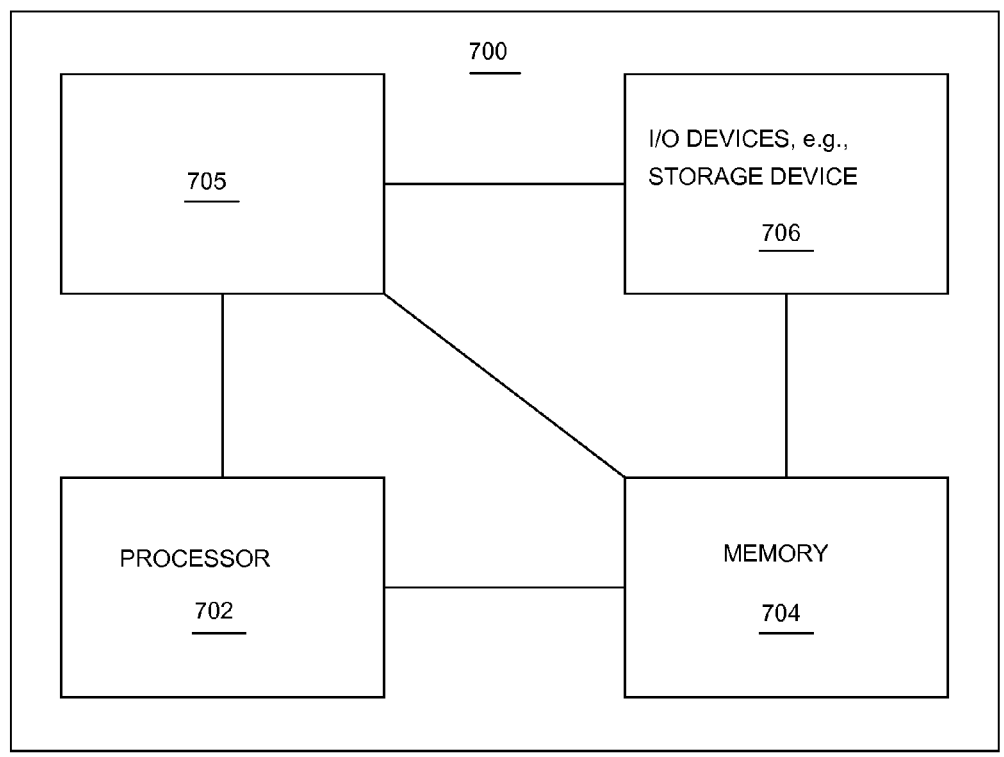
FIG. 7 illustrates a high level block diagram of a general purpose computer or a computing device suitable for use in performing the functions described herein.

FIG. 7 depicts a high level block diagram of a general purpose computer or a computing device suitable for use in performing some or all of the functions described herein. As depicted in FIG. 7, the system 700 comprises a processor element 702 (e.g., a CPU), a memory 704, e.g., random access memory (RAM) and/or read only memory (ROM), a module 705 for configuring a memory of an FPGA, and various input/output devices 706 (e.g., storage devices, including but not limited to, a memory device, a tape drive, a floppy drive, a hard disk drive or a compact disk drive, a receiver, a transmitter, a speaker, a display, a speech synthesizer, an output port, and a user input device (such as a keyboard, a keypad, a mouse, and the like)).

It should be noted that embodiments of the present invention can be implemented in software and/or in a combination of software and hardware, e.g., using application specific integrated circuits (ASIC), a general purpose computer or any other hardware equivalents such as microprocessors. In one embodiment, the present module or process for configuring a memory of an FPGA can be loaded into memory 704 and executed by processor 702 to implement the functions as discussed above. As such, the present module or process 705 for configuring a memory of an FPGA (including associated data structures) of embodiments of the present invention can be stored on a computer readable medium or carrier, e.g., RAM memory, magnetic or optical drive or diskette and the like.

While the foregoing describes exemplary embodiment(s) in accordance with one or more aspects of the present invention, other and further embodiment(s) in accordance with the one or more aspects of the present invention may be devised without departing from the scope thereof, which is determined by the claim(s) that follow and equivalents thereof. Claim(s) listing steps do not imply any order of the steps. Trademarks are the property of their respective owners.

What is claimed is:

1. A configuration management system, comprising:
   a configuration storage device containing configuration data; and
   an integrated circuit, coupled to said configuration storage device,
   wherein said integrated circuit comprises at least one configuration management controller for managing a configuration of said integrated circuit in accordance with said configuration data,
   wherein said integrated circuit is deployed in a radiation tolerant device, and
   wherein said at least one configuration management controller detects a single event upset (SEU) and effects a reconfiguration of said integrated circuit using said configuration data received from said configuration storage device.

2. The configuration management system of claim 1, wherein said integrated circuit is a field programmable gate array (FPGA).

3. The configuration management system of claim 1, wherein said at least one configuration management controller comprises a plurality of configuration management controllers.

4. The configuration management system of claim 3, wherein said plurality of configuration management controllers comprises three or more configuration management controllers.

5. The configuration management system of claim 1, wherein said at least one configuration management controller comprises a plurality of configuration management controllers, and wherein said single event upset (SEU) is detected by a majority of said plurality of configuration management controllers.

6. The configuration management system of claim 1, wherein said configuration storage device is deployed in a radiation hardened device.

7. The configuration management system of claim 1, further comprising:
   a watchdog circuit, coupled to said integrated circuit, wherein said watchdog circuit is for monitoring a heartbeat signal from said at least one configuration management controller.

8. The configuration management system of claim 7, wherein said watchdog circuit effects a reconfiguration of said integrated circuit using said configuration data received from said configuration storage device if said heartbeat signal from said at least one configuration management controller is not received within a predefined time period.

9. The configuration management system of claim 7, wherein said watchdog circuit effects a reconfiguration of said integrated circuit using said configuration data received from said configuration storage device if a signal indicating a single event upset (SEU) is detected by said at least one configuration management controller.

10. The configuration management system of claim 7, wherein said watchdog circuit is deployed in a radiation hardened device.

11. The configuration management system of claim 7, wherein said watchdog circuit comprises a signal detector, a counter and a signal generator.

12. A method for configuring an integrated circuit, comprising:
   detecting an event that requires a reconfiguration of a memory of the integrated circuit, wherein said event is detected by at least one configuration management controller in the integrated circuit;
   receiving configuration data stored in a configuration storage device; and
   configuring said memory of the integrated circuit in accordance with said configuration data, wherein said integrated circuit is deployed in a radiation tolerant device.

13. The method of claim 12, wherein said integrated circuit is a field programmable gate array (FPGA).

14. The method of claim 12, wherein said at least one configuration management controller comprises a plurality of configuration management controllers.

15. The method of claim 12, wherein said event is a single event upset (SEU).

16. The method of claim 15, wherein said at least one configuration management controller comprises a plurality of configuration management controllers, and wherein said single event upset (SEU) is detected by a majority of said plurality of configuration management controllers.

17. The method of claim 12, wherein said configuration storage device is deployed in a radiation hardened device.

18. The method of claim 12, further comprising:
monitoring a heartbeat signal from said at least one configuration management controller.

19. An integrated circuit, wherein said integrated circuit is in communication with a configuration storage device containing configuration data, comprising:
at least one configuration management controller for managing a configuration of said integrated circuit in accordance with said configuration data, wherein said integrated circuit is deployed in a radiation tolerant device.

* * * * *